(12) United States Patent
Chol et al.

(10) Patent No.: US 7,572,684 B2
(45) Date of Patent: Aug. 11, 2009

(54) NONVOLATILE MEMORY DEVICES AND METHODS OF FORMING THE SAME

(75) Inventors: Jung-Dal Chol, Gyeonggi-do (KR);
Jong-Sun Sel, Gyeonggi-do (KR);
Chang-Seok Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 11/646,217

(22) Filed: Dec. 27, 2006

(65) Prior Publication Data

US 2008/0096328 A1 Apr. 24, 2008

(30) Foreign Application Priority Data

Oct. 20, 2006 (KR) .................. 10-2006-0102406

(51) Int. Cl.
*H01L 21/335* (2006.01)
(52) U.S. Cl. .................. 438/142; 257/500; 257/501; 257/502; 257/503; 257/903; 257/E27.064; 257/E21.658; 257/E21.62
(58) Field of Classification Search .......... 438/142; 257/905, 500–503, E27.064, E21.658, E21.62
See application file for complete search history.

(56) References Cited

U.S. PATENT DOCUMENTS

| | | | | |
|---|---|---|---|---|
| 4,859,619 | A * | 8/1989 | Wu et al. ............... | 438/201 |
| 5,780,909 | A * | 7/1998 | Hayashi ............... | 257/393 |
| 5,990,507 | A * | 11/1999 | Mochizuki et al. ...... | 257/295 |
| 6,051,462 | A * | 4/2000 | Ohno ................. | 438/241 |
| 6,114,767 | A * | 9/2000 | Nagai et al. ............ | 257/758 |
| 6,117,725 | A * | 9/2000 | Huang ................. | 438/241 |
| 6,124,199 | A * | 9/2000 | Gambino et al. ........ | 438/622 |
| 6,140,672 | A * | 10/2000 | Arita et al. ............ | 257/295 |
| 6,197,639 | B1 * | 3/2001 | Lee et al. ............. | 438/258 |
| 6,218,197 | B1 * | 4/2001 | Kasai ................. | 438/3 |
| 6,268,633 | B1 * | 7/2001 | Pio et al. .............. | 257/391 |

(Continued)

FOREIGN PATENT DOCUMENTS

JP 2001-313374 11/2001

(Continued)

*Primary Examiner*—N Drew Richards
*Assistant Examiner*—Ankush K Singal
(74) *Attorney, Agent, or Firm*—Myers Bigel Sibley & Sajovec

(57) ABSTRACT

Nonvolatile memory devices, and methods of forming the same are disclosed. A memory device includes a substrate having a cell region, a low voltage region and a high voltage region. A ground selection transistor, a string selection transistor and a cell transistor are in the cell region, a low voltage transistor is in the low voltage region, and a high voltage transistor is in the high voltage region. A common source contact is on the ground selection transistor and a low voltage contact is on the low voltage transistor. A bit line contact is on the string selection transistor, a high voltage contact is on the high voltage transistor, and a bit line is on the bit line contact. A first insulating layer is on the substrate, and a second insulating layer is on the first insulating layer. The common source contact and the first low voltage contact extend to a height of the first insulating layer, and the bit line contact and the first high voltage contact extend to a height of the second insulating layer.

12 Claims, 14 Drawing Sheets

U.S. PATENT DOCUMENTS

| | | | | |
|---|---|---|---|---|
| 6,291,335 | B1* | 9/2001 | Schnabel et al. | 438/626 |
| 6,320,234 | B1* | 11/2001 | Karasawa et al. | 257/371 |
| 6,326,651 | B1* | 12/2001 | Manabe | 257/209 |
| 6,353,242 | B1* | 3/2002 | Watanabe et al. | 257/316 |
| 6,372,518 | B1* | 4/2002 | Nasu et al. | 438/3 |
| 6,376,307 | B1* | 4/2002 | Kim | 438/257 |
| 6,376,879 | B2* | 4/2002 | Mori et al. | 257/347 |
| 6,465,826 | B2* | 10/2002 | Kasai | 257/295 |
| 6,475,858 | B2* | 11/2002 | Sugiyama et al. | 438/241 |
| 6,500,677 | B2* | 12/2002 | Bergmann et al. | 438/3 |
| 6,501,138 | B1* | 12/2002 | Karasawa | 257/371 |
| 6,552,357 | B2* | 4/2003 | Akita | 257/10 |
| 6,627,928 | B2* | 9/2003 | Peschiaroli et al. | 257/288 |
| 6,717,206 | B2* | 4/2004 | Hsu et al. | 257/316 |
| 6,734,477 | B2* | 5/2004 | Moise et al. | 257/295 |
| 6,800,883 | B2* | 10/2004 | Furuya et al. | 257/206 |
| 6,852,585 | B2* | 2/2005 | Herzum et al. | 438/207 |
| 6,908,837 | B2* | 6/2005 | Taniguchi et al. | 438/583 |
| 7,011,999 | B2* | 3/2006 | Minami et al. | 438/210 |
| 7,145,200 | B2* | 12/2006 | Saito et al. | 257/315 |
| 7,166,901 | B2* | 1/2007 | Inoue et al. | 257/501 |
| 7,256,092 | B2* | 8/2007 | Chen et al. | 438/275 |
| 7,285,838 | B2* | 10/2007 | Ohkawa et al. | 257/500 |
| 2001/0019157 | A1* | 9/2001 | Pio et al. | 257/368 |
| 2001/0028080 | A1* | 10/2001 | Himeno et al. | 257/315 |
| 2002/0075720 | A1* | 6/2002 | Akita | 365/149 |
| 2002/0153548 | A1* | 10/2002 | Mizutani et al. | 257/296 |
| 2003/0222302 | A1* | 12/2003 | Saito et al. | 257/314 |
| 2004/0088658 | A1* | 5/2004 | Minda | 716/1 |
| 2004/0142526 | A1* | 7/2004 | Bae | 438/200 |
| 2004/0169250 | A1* | 9/2004 | Kobayashi | 257/510 |
| 2005/0093047 | A1* | 5/2005 | Goda et al. | 257/300 |
| 2005/0142756 | A1* | 6/2005 | Park et al. | 438/258 |
| 2005/0194639 | A1* | 9/2005 | Negoro et al. | 257/341 |
| 2006/0027864 | A1* | 2/2006 | Negoro et al. | 257/335 |
| 2006/0113547 | A1* | 6/2006 | Shin | 257/77 |
| 2006/0138568 | A1* | 6/2006 | Taniguchi et al. | 257/408 |
| 2006/0223269 | A1* | 10/2006 | Honma | 438/294 |
| 2007/0018226 | A1* | 1/2007 | Kamigaichi et al. | 257/313 |
| 2007/0109848 | A1* | 5/2007 | Sugimae et al. | 365/185.03 |
| 2007/0132033 | A1* | 6/2007 | Wu et al. | 257/371 |
| 2007/0187749 | A1* | 8/2007 | Sugimae et al. | 257/316 |
| 2007/0200166 | A1* | 8/2007 | Nakagawa | 257/316 |
| 2008/0067573 | A1* | 3/2008 | Jang et al. | 257/315 |
| 2008/0084728 | A1* | 4/2008 | Sakuma et al. | 365/63 |

FOREIGN PATENT DOCUMENTS

| | | |
|---|---|---|
| KR | 1999-0056024 | 7/1999 |
| KR | 100260559 B1 | 4/2000 |
| KR | 10-2005-0086291 | 8/2005 |
| KR | 10-2005-0086294 | 8/2005 |
| KR | 10-2005-0108141 | 11/2005 |
| KR | 1020060000022 A | 1/2006 |

\* cited by examiner

NONVOLATILE MEMORY DEVICES AND METHODS OF FORMING THE SAME

CROSS-REFERENCE TO RELATED APPLICATIONS

This U.S. non-provisional patent application claims priority under 35 U.S.C. § 119 to Korean Patent Application No. 2006-102406, filed on Oct. 20, 2006, the entire contents of which are hereby incorporated by reference.

FIELD OF THE INVENTION

The present invention disclosed herein relates to a semiconductor device, and more particularly, to a nonvolatile memory device and a method for forming the same.

BACKGROUND

In general, semiconductor memory devices include volatile memory devices that may lose stored information when the power supply thereto is cut off and nonvolatile memory devices that may retain stored information even when not powered.

A flash memory device is a nonvolatile memory device, and in general includes a cell array region and a peripheral circuit region. A ground selection transistor and a string selection transistor are formed in the cell array region, and a plurality of cell transistors are disposed between the ground selection transistor and the string selection transistor. A low voltage transistor and a high voltage transistor are disposed in the peripheral circuit region. A common source line is disposed at one side of the ground selection transistor, and a bit line contact is disposed at one side of the string selection transistor and is electrically connected with a bit line thereon. Contacts, pads and lines that are electrically connected to the low voltage transistor and the high voltage transistor are disposed in the peripheral circuit region.

Since flash memory devices may include many contacts, pads and lines that are disposed in the cell array region and the peripheral circuit region, the manufacturing process for flash memory devices may be complex.

SUMMARY

Some embodiments of the present invention provide methods of forming nonvolatile memory devices, and nonvolatile memory devices formed by the methods. Methods according to some embodiments of the invention may provide simplified manufacturing processes for nonvolatile memory devices.

Some embodiments of the present invention provide nonvolatile memory devices that include a substrate having a cell region, a low voltage region, and a high voltage region. A ground selection transistor, a string selection transistor, and a cell transistor are in the cell region, a low voltage transistor is in the low voltage region, and a high voltage transistor is in the high voltage region. A common source contact is on an impurity region of the ground selection transistor, and a first low voltage contact is on an impurity region of the low voltage transistor. A bit line contact is on an impurity region of the string selection transistor, and a first high voltage contact is on an impurity region of the high voltage transistor. A bit line is on the bit line contact. A first interlayer insulating layer is on the substrate, and a second interlayer insulating layer is on the first interlayer insulating layer. The common source contact and the first low voltage contact may extend to a height of the first interlayer insulating layer, and the bit line contact and the first high voltage contact may extend to the height of the second interlayer insulating layer.

In some embodiments, the memory device may further include a common source pad on the common source contact. The common source pad may electrically connect the common source contact to an adjacent common source contact. The memory device may further include a first low voltage pad on the first low voltage contact. The first low voltage pad and the common source pad may be on the first interlayer insulating layer. The memory device may further include a second low voltage contact on the first low voltage pad, and a second low voltage pad on the second low voltage contact. The second low voltage contact may extend to the height of the second interlayer insulating layer, and the second low voltage pad may be on the second interlayer insulating layer.

In other embodiments, the memory device may further include a low voltage gate contact on a gate of the low voltage transistor, and a high voltage gate contact on a gate of the high voltage transistor. The low voltage gate contact and the high voltage gate contact and the common source contact may extend to the height of the first interlayer insulating layer. The memory device may further include a low voltage gate pad on the low voltage gate contact, and a high voltage gate pad on the high voltage gate contact. The low voltage gate pad, the high voltage gate pad and the common source pad may be on the first interlayer insulating layer. The memory device may further include a second low voltage gate contact on the low voltage gate pad, and a second low voltage gate pad on the second low voltage gate contact. The second low voltage gate contact may extend to the height of the second interlayer insulating layer, and the second low voltage pad may and the bit line may be on the second interlayer insulating layer. The memory device may further include a second high voltage contact on the first high voltage pad, and a second high voltage pad on the second high voltage contact. The second high voltage contact may extend to the height of the second interlayer insulating layer, and the second high voltage pad and the bit line may be on the second interlayer insulating layer.

In still other embodiments, the memory device may further include a first high voltage pad on the first high voltage contact. The first high voltage pad may be on the second interlayer insulating layer. The memory device may further include a high voltage gate contact on a gate of the high voltage transistor, and a high voltage gate pad on the high voltage gate contact. The high voltage gate contact may extend to the height of the first interlayer insulating layer, and the high voltage gate pad may be on the first interlayer insulating layer.

Some embodiments of the present invention provide methods of forming nonvolatile memory devices on a substrate including a cell region, a low voltage region, and a high voltage region. The methods include forming a ground selection transistor, a string selection transistor, and a cell transistor in the cell region, forming a low voltage transistor in the low voltage region, and forming a high voltage transistor in the high voltage region. The methods may further include forming a common source contact on an impurity region of the ground selection transistor, and forming a first low-voltage contact on an impurity region of the low voltage transistor. A bit line contact is formed on an impurity region of the string selection transistor, and a first high voltage contact is formed on an impurity region of the high voltage transistor. A bit line is formed on the bit line contact.

In some embodiments, the methods may further include forming a common source pad on the common source contact before forming the bit line contact. The methods may further include forming a first low voltage pad on the first low voltage contact concurrently with forming the common source pad. A second low voltage contact may be formed on the first low voltage pad concurrently with the bit line contact, and a second low voltage pad may be formed on the second low voltage contact concurrently with forming the bit line.

In other embodiments, a low voltage gate contact may be formed on a gate of the low voltage transistor, and a high voltage gate contact may be formed on a gate of the high voltage transistor concurrently with forming the common source contact. A low voltage gate pad may be formed on the low voltage gate contact, and a high voltage gate pad may be formed on the high voltage gate contact concurrently with forming the common source pad. A second low voltage gate contact may be formed on the low voltage gate pad concurrently with forming the bit line contact, and a second low voltage gate pad may be formed on the low voltage gate contact concurrently with forming the bit line. A second high voltage gate contact may be formed on the high voltage gate pad concurrently with forming the bit line contact, and a second high voltage gate pad may be formed on the second high voltage gate contact concurrently with forming the bit line.

In still other embodiments, a first high voltage pad may be formed on the first high voltage contact concurrently with forming the bit line. A high voltage gate contact may be formed on a gate of the high voltage transistor concurrently with forming the bit line contact, and a high voltage gate pad may be formed on the high voltage gate contact concurrently with forming the bit line.

BRIEF DESCRIPTION OF THE DRAWINGS

The accompanying drawings, which are included to provide a further understanding of the invention and are incorporated in and constitute a part of this specification, illustrate certain embodiments of the invention. In the drawings.

DETAILED DESCRIPTION OF EMBODIMENTS OF THE INVENTION

Figure 1:
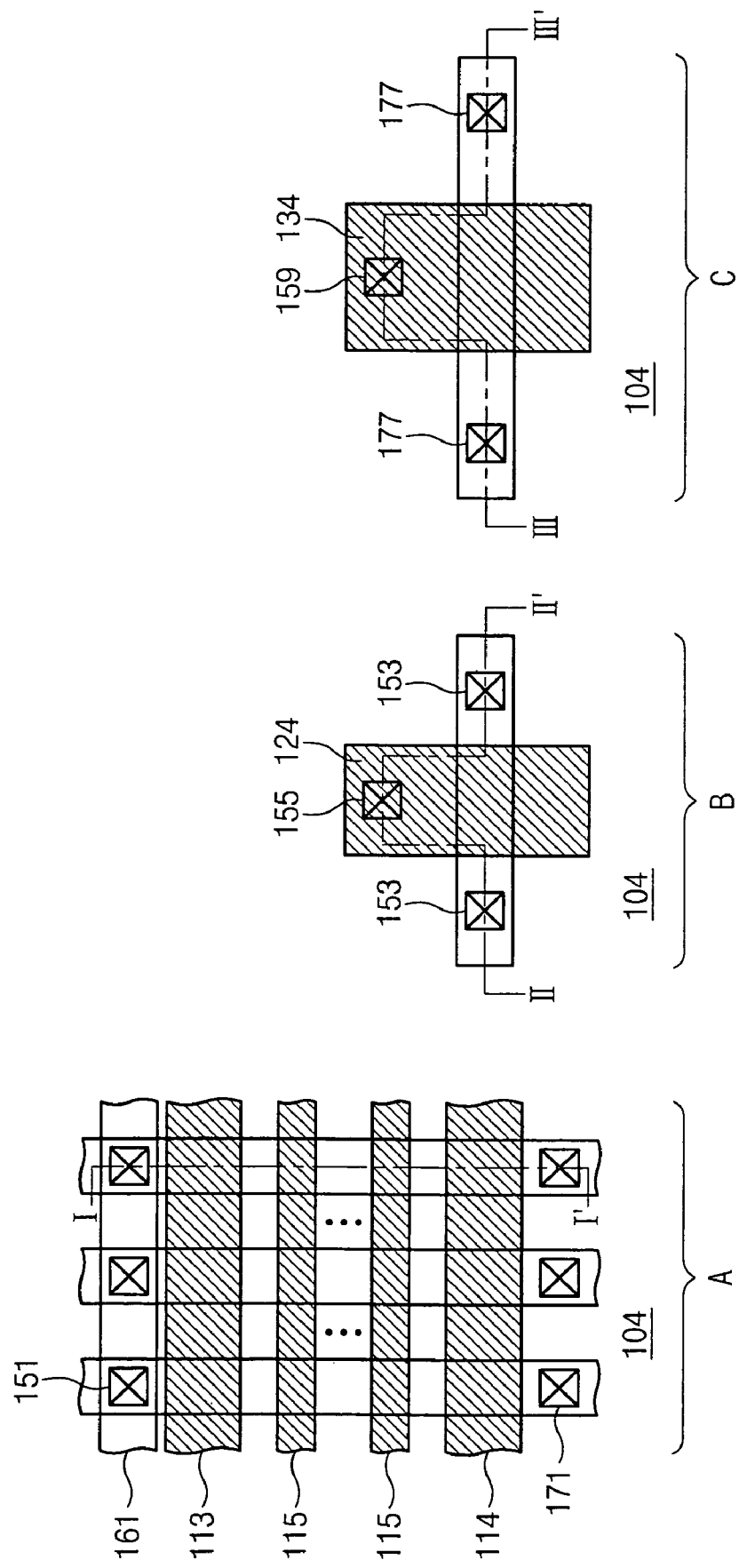
FIG. 1 is a schematic layout of a nonvolatile memory device according to some embodiments of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like numbers refer to like elements throughout.

It will be understood that although the terms first and second are used herein to describe various elements, these elements should not be limited by these terms. These terms are only used to distinguish one element from another element. It will also be understood that when a layer (or film) is referred to as being 'on' another layer or substrate, it can be directly on the other layer or substrate, or intervening layers may also be present. In the figures, the dimensions of layers and regions are exaggerated for clarity of illustration.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Some embodiments of the present invention are described below in conjunction with the accompanying drawings.

Device Structure

Figure 2:
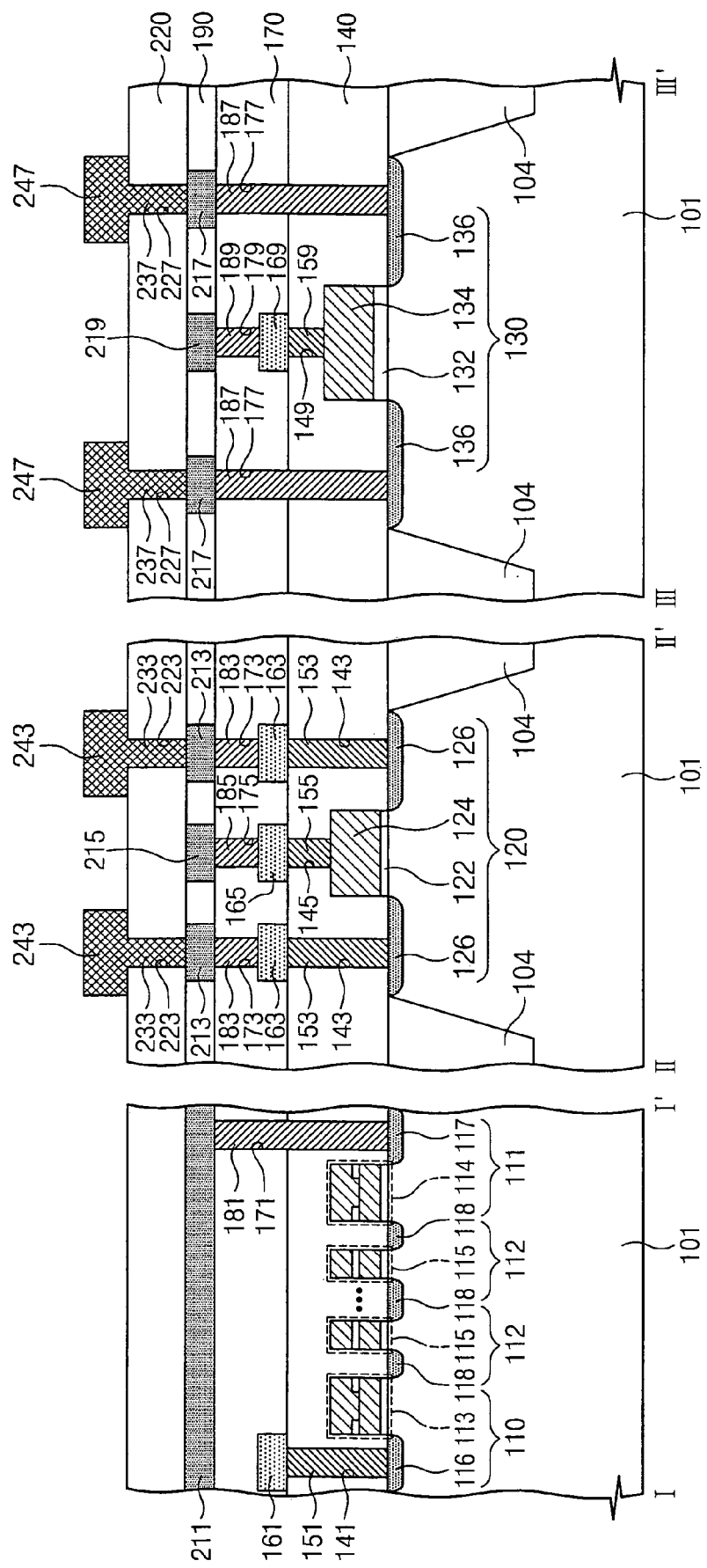
FIG. 2 is a cross-sectional view taken along lines I-I', II-II' and III-III' of FIG. 1 for describing nonvolatile memory devices according to some embodiments of the present invention.

FIG. 1 is a schematic layout of a nonvolatile memory device according to some embodiments of the present invention, and FIG. 2 is a cross-sectional view taken along lines I-I', II-II' and III-III' of FIG. 1 for describing nonvolatile memory devices according to some embodiments of the present invention.

Referring to FIGS. 1 and 2, device isolation layers defining active regions are disposed in a semiconductor substrate including a cell region A, a low voltage region B, and a high voltage region C.

As for the cell region A, a ground selection transistor 110, a string selection transistor 111, and a plurality of cell transistors 112 between the ground selection transistor 110 and the string selection transistor 111 are placed in the cell region A. The ground selection transistor 110 includes a ground selection gate structure 113, and impurity regions 116 and 118 at both sides of the ground selection gate structure 113. The string selection transistor 111 includes a string selection gate structure 114, and impurity regions 117 and 118 at both sides of the string selection gate structure 114. The cell transistor 112 includes a cell gate structure 115, and impurity regions 118 at both sides of the cell gate structure 115. Hereinafter, for convenience in description, the impurity regions 116, 117 and 118 placed in the cell region A are referred to as a ground impurity region 116, a string impurity region 117, and a cell impurity region 118, respectively. That is, the impurity regions at both sides of the ground selection gate structure 113 are the cell impurity region 118 and the ground impurity region 116. The impurity regions at both sides of the string selection gate structure 114 are the cell impurity region 118 and the string impurity region 117. Also, the impurity regions at both sides of the cell gate structure 115 are the cell impurity regions 118.

A first interlayer insulating layer 140 covering the ground selection transistor 110, the string selection transistor 111, and the cell transistors 112 is placed on the substrate 101. A common source contact 151 penetrating the first interlayer insulating layer 140 is placed on the ground impurity region 1116, and a common source pad 161 is placed on the common source contact 151. A second interlayer insulating layer 170 covering the common source pad 161 is placed on the first interlayer insulating layer 140. A bit line contact 181 penetrating the first and second interlayer insulating layers 140 and 170 is placed on the string impurity region 117. A molding insulating layer 190 is placed on the second interlayer insulating layer 170, and a bit line 211 contacting the bit line contact 181 is placed in the molding insulating layer 190. A third interlayer insulating layer 220 is placed on the molding insulating layer 190. In FIG. 2, the molding insulating layer 190 is not shown in the cell region A since the view of FIG. 2 with respect to the cell region A is a cross-sectional view taken along a bit-line direction.

Next, as for the low voltage region B, a low-voltage transistor 120 is placed in the low voltage region B. The low-voltage transistor 120 includes a low-voltage gate 124 disposed on the substrate 101, with a low-voltage gate insulating layer 122 interposed therebetween, and low-voltage impurity regions 126 at both sides of the low voltage gate 124.

The first interlayer insulating layer 140 covering the low-voltage transistor 120 is placed on the substrate 101. First low-voltage contacts 153 and a low-voltage gate contact 155 penetrating the first interlayer insulating layer 140 are placed on the low-voltage impurity regions 126 and the low-voltage gate 124, respectively. First low-voltage pads 163 are placed on the respective low-voltage contacts 153, and a low-voltage gate pad 165 is placed on the low-voltage gate contact 155. The second interlayer insulating layer 170 covering the first low-voltage pads 163 and the low-voltage gate pad 165 is placed on the first interlayer insulating layer 140. Second low-voltage contacts 183 and a second low-voltage gate contact 185 penetrating the second interlayer insulating layer 170 are placed on the first low-voltage pads 163 and the low-voltage gate pad 165, respectively.

The molding insulating layer 190 is placed on the second interlayer insulating layer 170, and second low-voltage pads 213 and a second low-voltage gate pad 215 contacting the second low-voltage contacts 183 and the second low-voltage gate contact 185, respectively, are placed in the molding insulating layer 190. The third interlayer insulating layer 220 is placed on the molding insulating layer 190, and low-voltage lines 243 are placed on the third interlayer insulating layer 220. The low-voltage lines 243 are electrically connected to the second low-voltage pads 213 by vias 233 penetrating the third interlayer insulating layer 220, respectively.

Then, as for the high voltage region C, a high-voltage transistor 130 is placed in the high voltage region C. The high-voltage transistor 130 includes a high-voltage gate 134 disposed on the substrate 101, with a high-voltage gate insulating layer 132 interposed therebetween, and high-voltage impurity regions 136 at both sides of the high-voltage gate 134. A thickness of the high-voltage gate insulating layer 132 may be thicker than that of the low-voltage gate insulating layer 122.

The first interlayer insulating layer 140 covering the high-voltage transistor 130 is placed on the substrate 101. A high-voltage gate contact 159 penetrating the first interlayer insulating layer 140 is placed on the high-voltage gate 134. A high-voltage gate pad 169 is placed on the high-voltage gate contact 159. The second interlayer insulating layer 170 covering the high-voltage gate pad 169 is placed on the first interlayer insulating layer 140. First high-voltage contacts 187 penetrating the first and second interlayer insulating layers 140 and 170 are placed on the high-voltage impurity regions 136, and a second high-voltage gate contact 189 penetrating the second interlayer insulating layer 170 is placed on the high-voltage gate pad 169.

The molding insulating layer 190 is placed on the second interlayer insulating layer 170, and first high-voltage pads 217 and a second high-voltage gate pad 219 contacting the first high-voltage contacts 187 and the second high-voltage gate contact 189, respectively, are placed in the molding insulating layer 190. The third interlayer insulating layer 220 is placed on the molding insulating layer 190, and high-voltage lines 247 are placed on the third interlayer insulating layer 220. The high-voltage lines 247 are electrically connected to the high-voltage pads 217 by vias 237 penetrating the third interlayer insulating layer 220, respectively.

In the present embodiment, the common source contact 151, the first low-voltage contacts 153, the low-voltage gate contact 155, and the high-voltage gate contact 159 may be formed of the same material, and the common source pad 161, the first low-voltage pads 163, the low-voltage gate pad 165, and the high-voltage gate pad 169 may be formed of the same material. Also, the bit line contact 181, the second low-voltage contacts 183, the second low-voltage gate contact 185, the first high-voltage contacts 187 and the second high-voltage gate contact 189 may be formed of the same material. In addition, the bit line 211, the second low-voltage pads 213, the second low-voltage gate pad 215, the first high-voltage pads 217 and the second high-voltage gate pad 219 may be formed of the same material.

Figure 3:
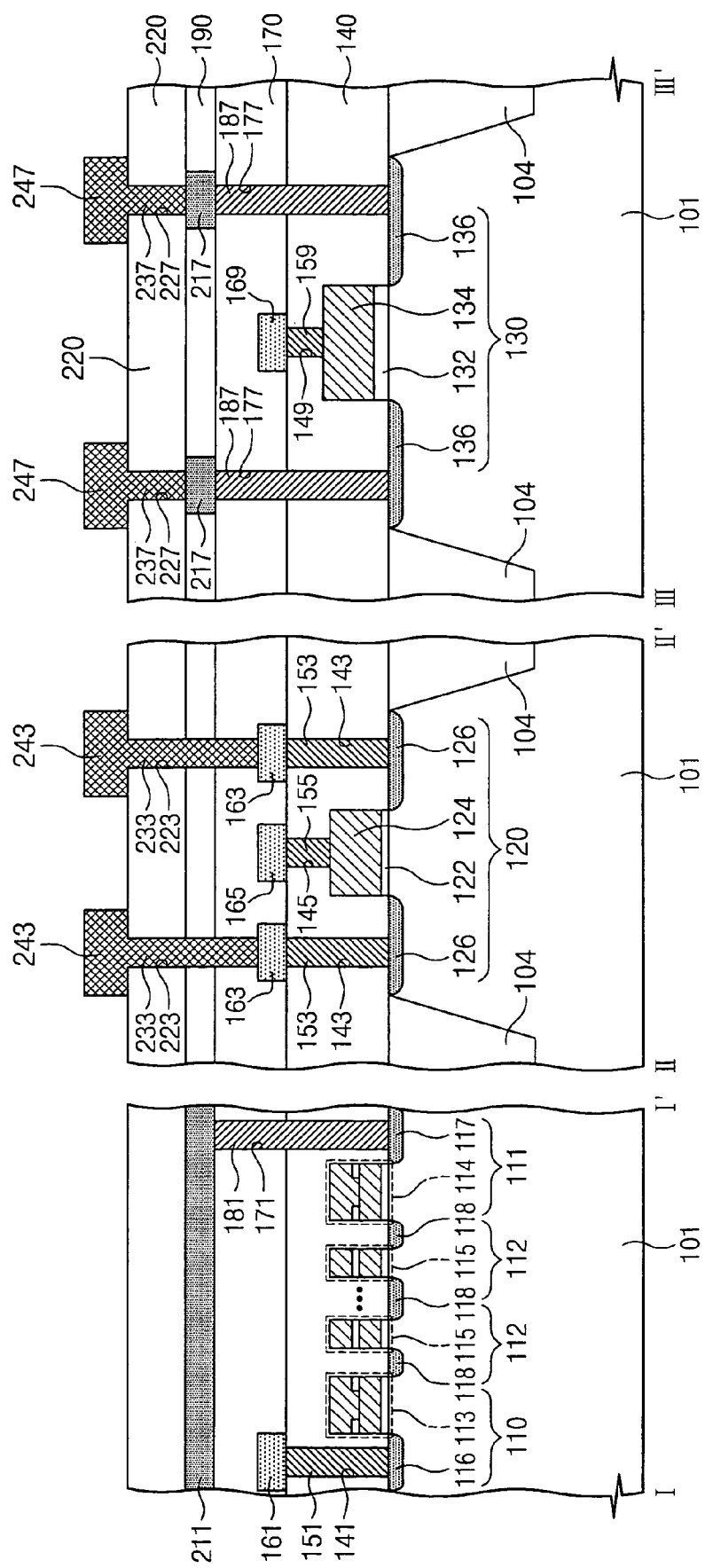
FIG. 3 is a cross-sectional view taken along lines I-I', II-II' and III-III' for describing nonvolatile memory devices according to further embodiments of the present invention.

FIG. 3 is a cross-sectional view taken along lines I-I', II-II' and III-III" of FIG. 1 for describing nonvolatile memory devices according to further embodiments of the present invention. In the embodiments of FIG. 3, description of the same elements as those described in connection with FIG. 2 will be omitted, and primarily only the differences therebetween will be described.

Referring to FIGS. 1 and 3, the second low-voltage contacts 183 and the second low-voltage pads 213, which were used in the previous embodiment of FIG. 2, are not included. Thus, in some embodiments, the first low-voltage contacts 153 are electrically connected to low-voltage lines 243 by low-voltage vias 233 penetrating a second interlayer insulating layer 170, a molding insulating layer 190, and a third interlayer insulating layer 220.

Also, in a low voltage region B, the second low-voltage gate contact 185 and the second low-voltage gate pad 215, which were used in the previous embodiment of FIG. 2, may not be included in some embodiments. Likewise, in a high voltage region C, the second high-voltage gate contact 189 and the second high-voltage gate pad 219, which were used in the previous embodiment of FIG. 2, may not be included in some embodiments.

According to some embodiments of the present invention, contacts and pads disposed in the low voltage region B and the high voltage region C may be formed of the same material as the common source contact, the common source pad, the bit line contact and the bit line disposed in the cell region. Also, the contacts and pads disposed in the low voltage region B and the high voltage region C may be disposed into various structures.

Methods of Forming Nonvolatile Memory Devices

FIGS. 4 through 10 are cross-sectional views taken along lines I-I', II-II' and III-III' of FIG. 1 for describing a method for forming the nonvolatile memory device of FIG. 2.

Figure 4:
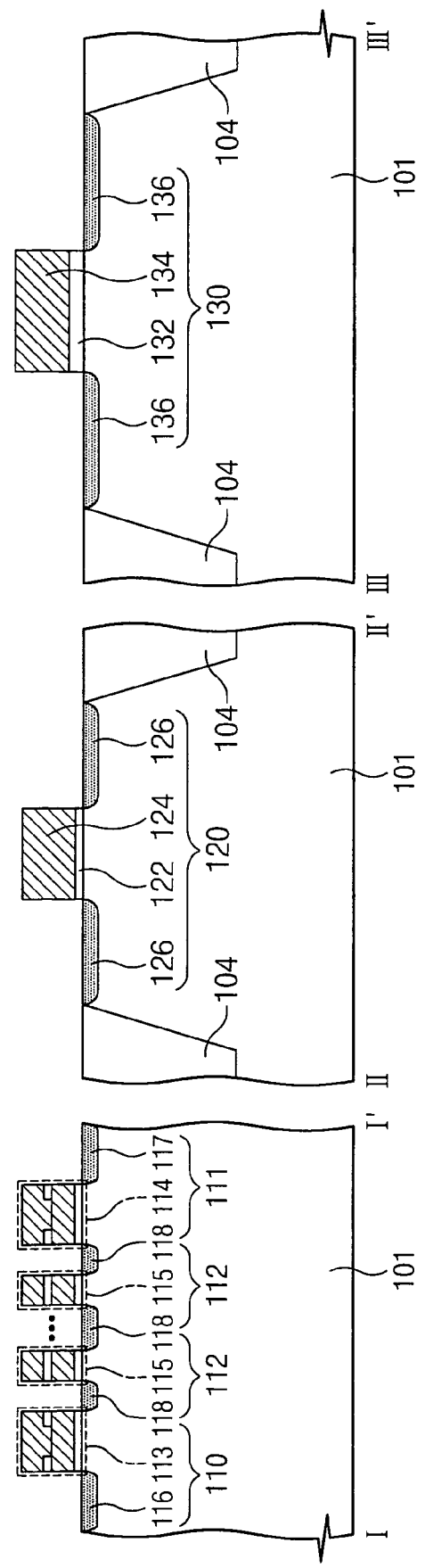
FIGS. 4 through 10 are cross-sectional views taken along lines I-I', II-II', and III-III' of FIG. 1 for describing methods of forming the nonvolatile memory device of FIG. 2.

Referring to FIGS. 1 and 4, a semiconductor substrate 101 including a cell region A, a low voltage region B and a high voltage region C is provided. Device isolation layers 104 defining active regions in the substrate 101 are formed. A ground selection transistor 110 and a string selection transistor 111 are formed in the cell region A, and a plurality of cell transistors 112 are formed between the ground selection transistor 110 and the string selection transistor 111. The ground selection transistor 110 includes a ground selection gate structure 113, and impurity regions at both sides of the ground selection gate structure 113, namely, a cell impurity region 118 and a ground impurity region 116. The string selection transistor 111 includes a string selection gate structure 114, and impurity regions at both sides thereof, namely, a cell impurity region 118 and a string impurity region 117. The cell transistor 112 includes a cell gate structure 115, and cell impurity regions 118 at both sides thereof. A low-voltage transistor 120 is formed in the low voltage region B. The low-voltage transistor 120 includes a low-voltage gate 124 formed on the substrate 101, with a low-voltage gate insulating layer 122 interposed therebetween, and low-voltage impurity regions 126 at both sides of the low-voltage gate 124. A high-voltage transistor 130 is formed in the high voltage region C. The high-voltage transistor 130 includes a high-voltage gate 134 formed on the substrate 101, with a high-voltage gate insulating layer 132 interposed therebetween, and high-voltage impurity regions 136 at both sides of the high-voltage gate 134. The high-voltage gate insulating layer 132 may be thicker than the low-voltage gate insulating layer 122.

Figure 5:
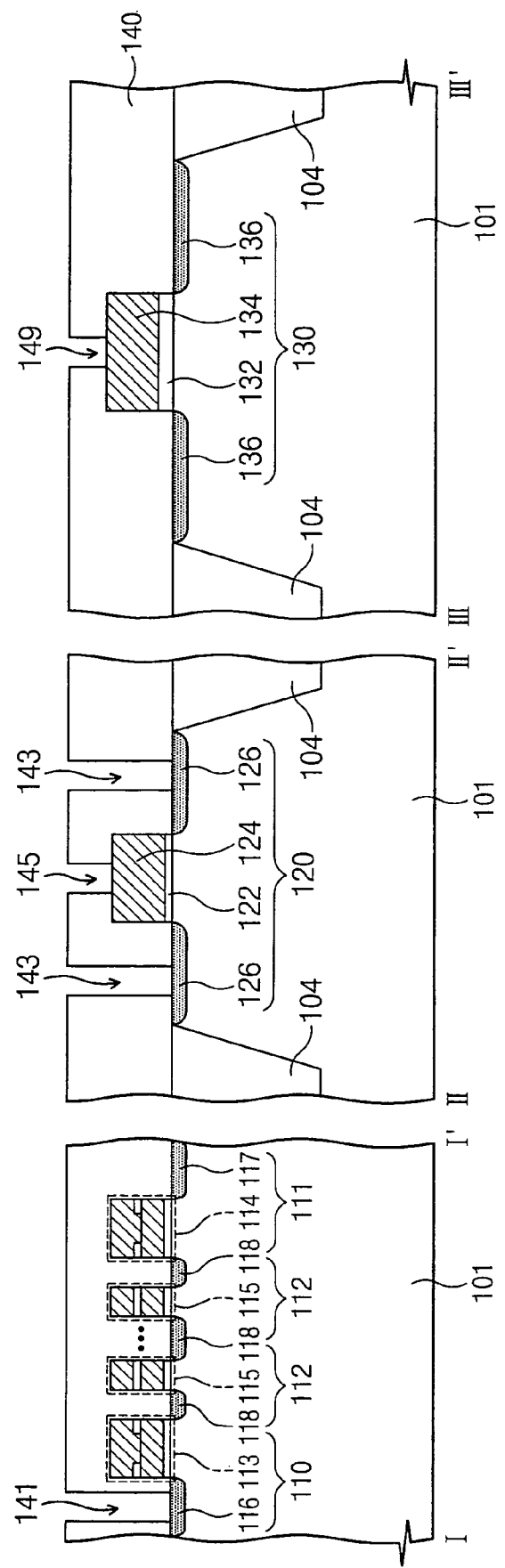

Referring to FIGS. 1 and 5, a first interlayer insulating layer 140 is formed on the substrate 101, and is patterned to form contact holes 141, 143, 145 and 149. The contact hole 141 exposing the ground impurity region 116 is formed in the cell region A, the contact holes 143 and 145 exposing the low-voltage gate 124 and the low-voltage impurity regions 126 are formed in the low voltage region B, and the contact hole 149 exposing the high-voltage gate 134 is formed in the high voltage region C.

Figure 6:
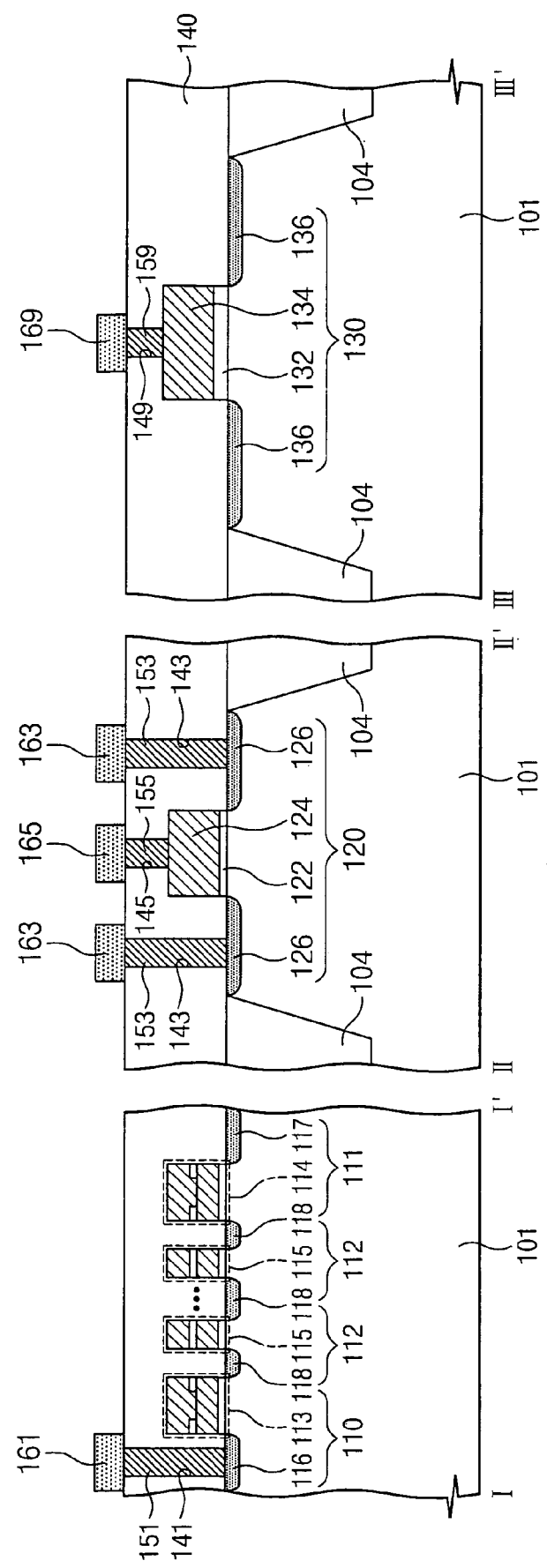

Referring to FIGS. 1 and 6, a common source contact 151 contacting the ground impurity region 116, first low-voltage contacts 153 contacting the low-voltage impurity regions 126, a low-voltage gate contact 155 contacting the low-voltage gate 134, and a high-voltage gate contact 159 contacting the high-voltage gate 134 are formed in the contact holes 141, 143, 145 and 149, respectively.

The common source contact 151, the first low-voltage contact 153, the low voltage gate contact 155, and the high-voltage gate contact 159 may be formed concurrently. That is, a thin film forming process is performed to fill the contact holes 141, 143, 145 and 149 with a conductive material, for example, tungsten and/or polysilicon, and then a planarization process is performed to expose the first interlayer insulating layer 140, thereby forming the common source contact 151, the first low-voltage contact 153, the low-voltage gate contact 155, and the high-voltage gate contact 159 concurrently (i.e. at the same time).

Thereafter, a common source pad 161 is formed on the common source contact 151, and first low-voltage pads 163 and a low-voltage gate pad 165 are formed on the first low-voltage contacts 153 and the low-voltage gate contact 155, respectively. Also, a high-voltage gate pad 169 is formed on the high-voltage gate contact 159. The pads 161, 163, 165 and 169 may be formed by forming a conductive layer on the first interlayer insulating layer 140 and patterning the conductive layer. Thus, the common source pad 161, the first low-voltage pad 163, the low-voltage gate pad 165, and the high-voltage gate pad 169 may be concurrently formed of the same material. The pads 161, 163, 165 and 169 may be formed of a metal material, for example, tungsten.

When formed of the same materials, the contacts 151, 153, 155 and 159, and the pads 161, 163, 165 and 169 may be formed by performing a thin film forming process once and then performing patterning process.

Figure 7:
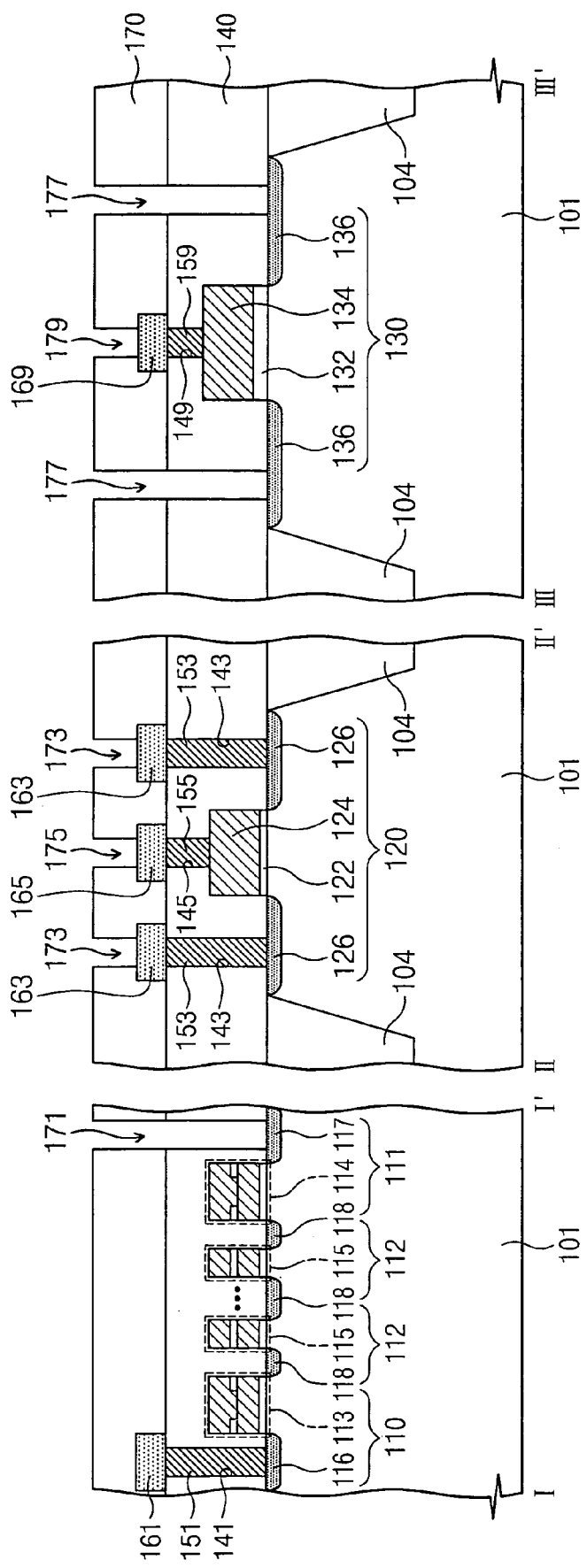

Referring to FIGS. 1 and 7, a second interlayer insulating layer 170 is formed on the first interlayer insulating layer 140, and then an etching process is performed to form contact holes 171, 173, 175, 177 and 179. In the cell region A, the first and second interlayer insulating layers 140 and 170 are patterned to form the contact hole 171 exposing the string impurity region 117. In the low voltage region B, the second interlayer insulating layer 170 is patterned to form the contact holes 173 and 175 exposing the first low-voltage pads 163 and the low-voltage gate pad 165. In the high voltage region C, the first and second interlayer insulating layers 140 and 170 are patterned to form the contact holes 177 exposing the high-voltage impurity regions 136, and the second interlayer insulating layer 170 is patterned to form the contact hole 179 exposing the high-voltage gate pad 169. While the first interlayer insulating layer 140 is being etched, the first low-voltage pad 163, the low-voltage gate pad 165, and the high-voltage gate pad 169 may function as an etch stop layer.

Figure 8:
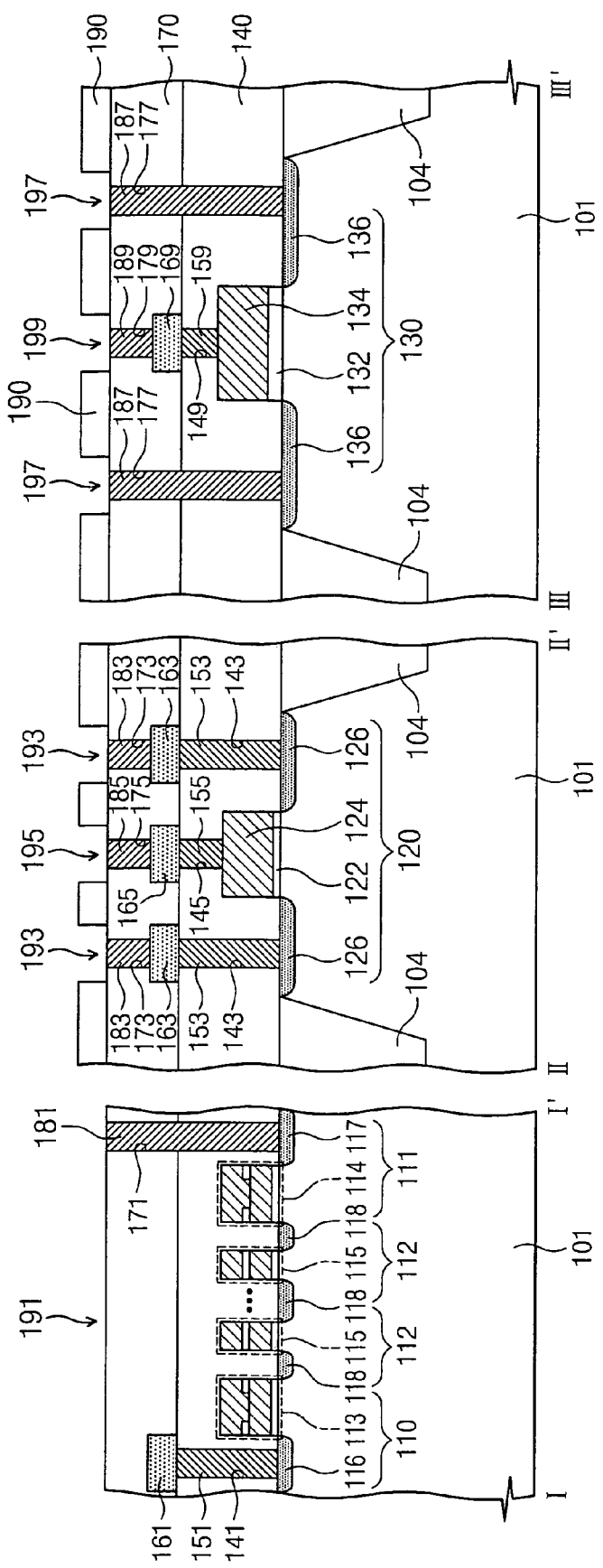

Referring to FIGS. 1 and 8, a bit line contact 181 contacting the string impurity region 117, second low-voltage contacts 183 contacting the first low-voltage pads 163, a second low-voltage gate contact 185 contacting the low-voltage gate pad 165, first high-voltage contacts 187 contacting the high-voltage impurity regions 136, and a second high-voltage gate contact 189 contacting the high-voltage gate pad 169 are formed in the respective contact holes 171, 173, 175, 177 and 179.

The bit line contact 181, the second low-voltage contact 183, the second low-voltage gate contact 185, the first high-voltage contact 187, and the second high-voltage gate contact 189 may be formed concurrently. That is, a thin film forming process may be performed to fill the contact holes 171, 173, 175, 177 and 179 with a conductive material, for example, tungsten, and then a planarization process is performed to expose the second interlayer insulating layer 170, thereby forming the bit line contact 181, the second low-voltage contact, 183, the second low-voltage gate contact 185, the first high-voltage contact 187 and the second high-voltage gate contact 189 concurrently.

Thereafter, a molding insulating layer 190 is formed on the second interlayer insulating layer 170, and is patterned to form an opening 191 exposing the bit line contact 181 in the cell region A, to form openings 193 and 195 exposing the third low-voltage contacts 183 and the second low-voltage gate contact 185 in the low voltage region B, and to form openings 197 and 199 exposing the first high-voltage contacts 187 and the second high-voltage gate contact 189 in the high voltage region C.

Figure 9:
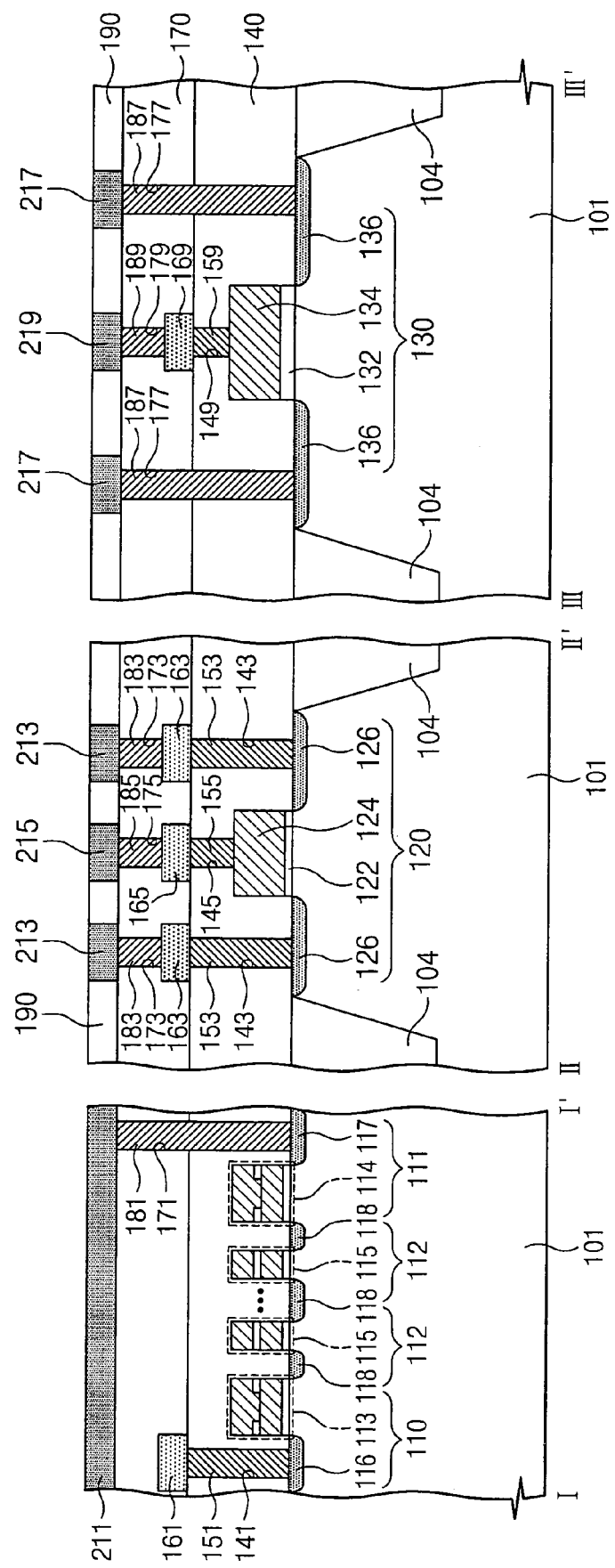

Referring to FIGS. 1 and 9, a bit line 211 contacting the bit line contact 181, second low-voltage pads 213 contacting the second low-voltage contacts 183, a second low-voltage gate pad 215 contacting the second low-voltage gate contact 185, first high-voltage pads 217 contacting the first high-voltage contacts 187, and a second high-voltage gate pad 219 contacting the second high-voltage gate contact 189 are formed in the respective openings 191, 193, 195, 197 and 199.

The bit line 211, the third low-voltage pads 213, the second low-voltage gate pad 215, the first high-voltage pads 217 and the second high-voltage gate pad 219 may be formed concurrently. That is, a thin film forming process may be performed to fill the apertures with a metal material, for example, copper, and then a planarization process is performed to expose the molding insulating layer 190, thereby concurrently forming the bit line 211, the second low-voltage pads 213, the second low-voltage gate pad 215, the first high-voltage pads 217 and the second high-voltage gate pad 219.

Although the bit line 211 and the pads 213, 215, 217 and 219 may be formed using a damascene process as described above, the bit line and pads may be formed, for example, by forming and patterning a conductive layer.

Figure 10:
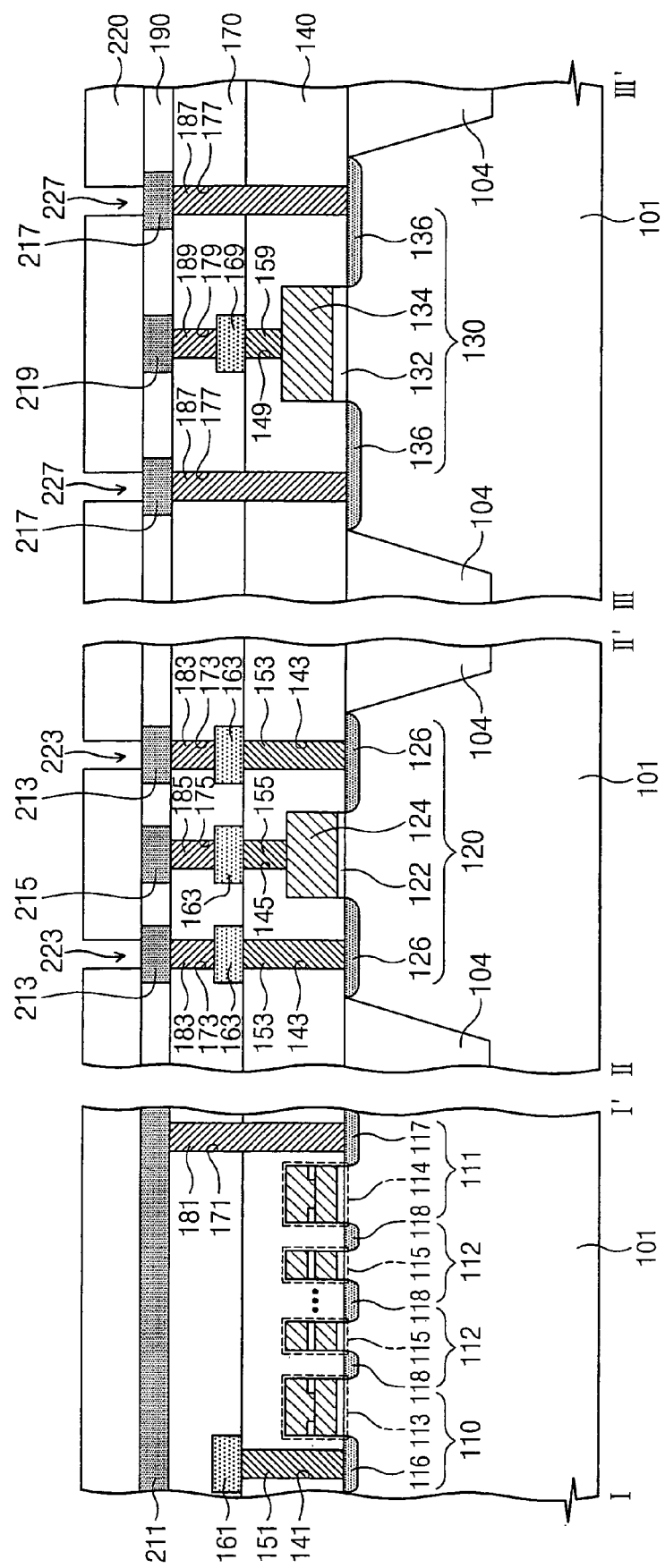

Referring to FIGS. 1 and 10, a third interlayer insulating layer 220 is formed on the molding insulating layer 190, and then is patterned to form via holes 223 and 227. The via holes 223 exposing the second low voltage pads 213 are formed in the low voltage region B, and the via holes 227 exposing the first high-voltage pads 217 are formed in the high voltage region C. Although not shown, a via hole exposing the second low-voltage gate pad 215, and a via hole exposing the second high-voltage gate pad 219 may be further formed.

Referring again to FIGS. 1 and 2, low-voltage vias 233 contacting the second low-voltage pads 213, and high-voltage vias 237 contacting the first high-voltage pads 217 are formed in the respective via holes 223 and 227. Low-voltage lines 243, and high-voltage lines 247 are formed on the low-voltage vias 233 and the high-voltage vias 237, respectively.

The vias 233 and 237, and the lines 243 and 247 may be formed by forming a conductive layer of metal, for example, aluminum to fill the via holes 223 and 227, and then patterning the conductive layer. That is, the vias 233 and 237, and the lines 243 and 247 may be formed by performing one thin film forming process and patterning the same.

Although the high-voltage gate contact 159, the high-voltage gate pad 169, the second high-voltage gate contact 189, and the second high-voltage gate pad 219 may be formed on the high-voltage gate 134 as described above, the construction thereof may vary. For example, the second high-voltage gate contact 189 may be formed to contact the high-voltage gate 134, without forming the high-voltage gate contact 159 and the high-voltage gate pad 169.

FIGS. 11 through 14 are cross-sectional views taken along lines I-I', II-II' and III-III' of FIG. 1 for describing methods of forming the nonvolatile memory device of FIG. 3.

Figure 11:
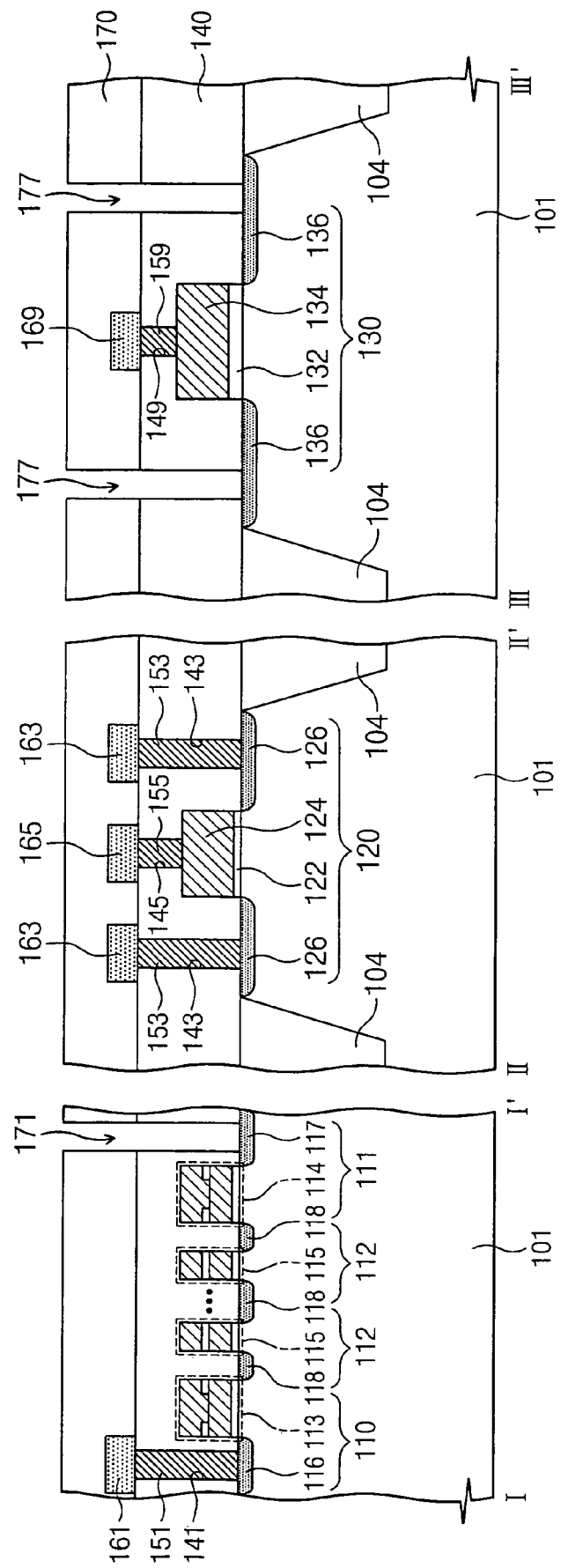
FIGS. 11 through 14 are cross-sectional views taken along lines I-I', II-II' and III-III' of FIG. 1 for describing methods of forming the nonvolatile memory device of FIG. 3.

Referring to FIGS. 1 and 11, a second interlayer insulating layer 170 is formed on a first interlayer insulating layer 140, and then an etching process is performed to form contact holes 171 and 177. In a cell region A, the first and the second interlayer insulating layers 140 and 170 are patterned to form the contact hole 171 exposing a string impurity region 117. In a high voltage region C, the first and second interlayer insulating layer 140 and 170 are patterned to form the contact holes 177 exposing the high-voltage impurity regions 136.

Figure 12:
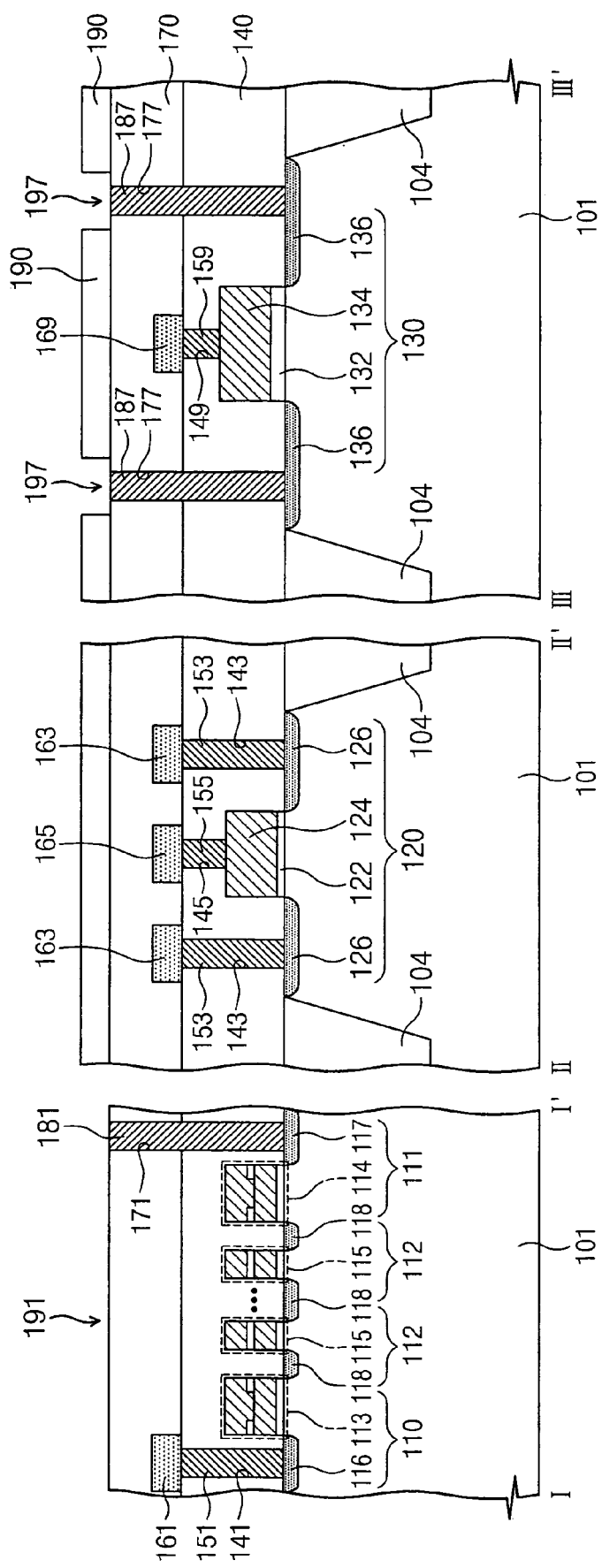

Referring to FIGS. 1 and 12, a bit line contact 181 contacting the string impurity region 117, and first high-voltage contacts 187 contacting the high-voltage impurity regions 136 are formed in the contact holes 171 and 177, respectively.

The bit line contact 181 and the first high-voltage contacts 187 may be formed concurrently. That is, a thin film forming process may be performed to fill the contact holes 171 and 177 with a conductive material, for example, tungsten and/or polysilicon, and then a planarization process may be performed to expose the second interlayer insulating layer 170.

Thereafter, a molding insulating layer 190 is formed on the second interlayer insulating layer 170, and is patterned to form an opening 191 exposing the bit line contact 181 in the cell region A, and to form openings 197 exposing the first high-voltage contacts 187 in the high voltage region C.

Figure 13:
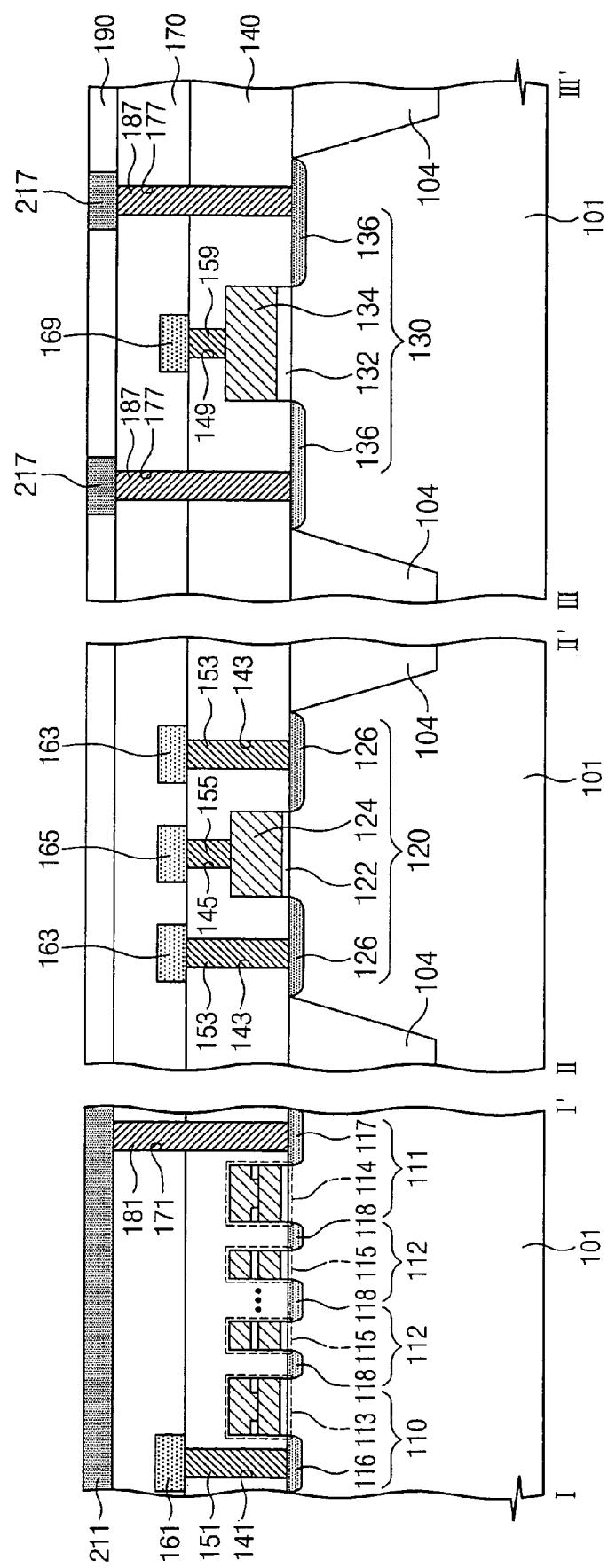

Referring to FIGS. 1 and 13, a bit line 211 contacting the bit line contact 181, and first high-voltage pads 217 contacting the first high-voltage contacts 187 are formed in the openings 191 and 197, respectively.

The bit line 211 and the first high-voltage pads 217 may be formed concurrently. That is, the bit line 211 and the first high-voltage pads 217 may be formed by performing a thin film forming process to fill the apertures 191 and 197 with a metal material, for example, copper, and then performing a planarization process exposing the molding insulating layer 190.

Figure 14:
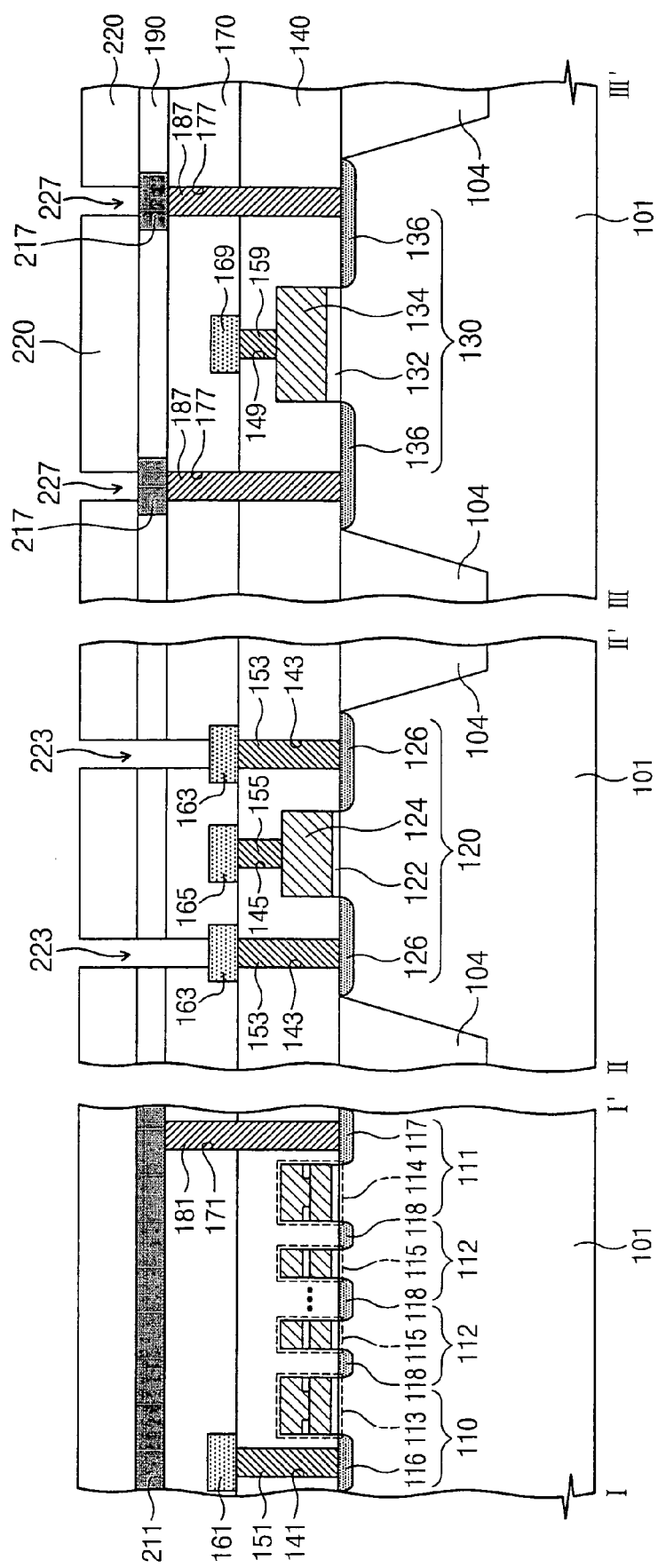

Referring to FIGS. 1 and 14, a third interlayer insulating layer 220 is formed on the molding insulating layer 190, and then an etching process is performed to form via holes 223 and 227. In the low voltage region B, the second interlayer insulating layer 170, the molding insulating layer 190, and the third interlayer insulating layer 220 are patterned to form the via holes 223 exposing the first low-voltage pads 163. In the high voltage region C, the third interlayer insulating layer 220 is patterned to form the via holes 227 exposing the first high-voltage pads 217. While the second interlayer insulating layer 170 and the molding insulating layer 190 are etched, the first high-voltage pads 217 may function as an etch stop layer. Although not shown, a via hole exposing a low-voltage gate pad 165, and a via hole exposing a high-voltage gate pad 169 may be further formed.

Referring to FIGS. 1 and 3 again, low-voltage vias 233 contacting the first low-voltage pads 163, and high-voltage vias 237 contacting the first high-voltage pads 217 are formed in the via holes 223 and 227, respectively. Low-voltage lines 243 and high-voltage lines 247 are formed on the low-voltage vias 233 and the high-voltage vias 237, respectively. The vias 233 and 237, and the lines 243 and 247 may be formed by forming a conductive layer to fill the via holes with a metal layer, for example, aluminum, and then patterning the conductive layer.

According to some embodiments according to the present invention, when a common source contact and a bit line contact are formed in a cell region, contacts of a low voltage region and a high voltage region may be formed at the same time. Thus, a manufacturing process can be simplified. Also, when a common source pad and a bit line are formed in the cell region, pads may be formed simultaneously in the low voltage region and the high voltage region.

According to some embodiments of the present invention, when a first high-voltage contact contacting a high-voltage impurity region is formed of polysilicon, not metal, the first high-voltage contact may have a higher breakdown voltage than that of a high-voltage contact made of metal. Thus, the area of a high-voltage impurity region can be reduced, so that high integration of a memory device can be achieved.

According to some embodiments of the present invention, a process of manufacturing a nonvolatile memory device is simplified. Also, increased integration of nonvolatile memory devices can be achieved.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A nonvolatile memory device comprising:
    a substrate comprising a cell region, a low voltage region, and a high voltage region;
    a ground selection transistor, a string selection transistor, and a cell transistor in the cell region, a low voltage transistor in the low voltage region, and a high voltage transistor in the high voltage region;
    a common source contact on an impurity region of the ground selection transistor, and a first low voltage contact on an impurity region of the low voltage transistor;
    a bit line contact on an impurity region of the string selection transistor, and a first high voltage contact on an impurity region of the high voltage transistor;
    a bit line on the bit line contact;
    a first interlayer insulating layer on the substrate; and
    a second interlayer insulating layer on the first interlayer insulating layer;
    wherein the common source contact and the first low voltage contact penetrate the first interlayer insulating layer, and wherein the bit line contact and the first high voltage contact penetrate the first interlayer insulating layer and the second interlayer insulating layer, and wherein heights of the common source contact and the low voltage contact are lower than heights of the bit line contact and the first high voltage contact.

2. The nonvolatile memory device of claim 1, further comprising a common source pad on the common source contact, the common source pad electrically connecting the common source contact to an adjacent common source contact.

3. The nonvolatile memory device of claim 1, further comprising a first high voltage pad on the first high voltage contact,
    wherein the first high voltage pad is on the second interlayer insulating layer.

4. The nonvolatile memory device of claim 1, further comprising:
    a first conductive layer on the first interlayer insulating layer, the first conductive layer including a common source pad and a first low voltage pad; and
    a second conductive layer on the second interlayer insulating layer, wherein the first conductive layer and the second conductive layer are separated by the second interlayer insulation layer, the second conductive layer including a high voltage pad and the bit line;
    wherein the common source contact contacts the common source pad, the low voltage contact contacts the first low voltage pad, the bit line contact contacts the bit line, and the high voltage contact contacts the high voltage pad.

5. The nonvolatile memory device of claim 1, wherein upper surfaces of the common source contact and the first low voltage contact have substantially the same height as an upper surface of the first interlayer insulating layer, and wherein upper surfaces of the bit line contact and the first high voltage contact have substantially the same height as an upper surface of the second interlayer insulating layer.

6. The nonvolatile memory device of claim 2, further comprising a first low voltage pad on the first low voltage contact,
    wherein the first low voltage pad and the common source pad are on the first interlayer insulating layer.

7. The nonvolatile memory device of claim 2, further comprising a first low voltage gate contact on a gate of the low voltage transistor, and a first high voltage gate contact on a gate of the high voltage transistor,
    wherein the first low voltage gate contact, the first high voltage gate contact and the common source contact penetrate the first interlayer insulating layer.

8. The nonvolatile memory device of claim 6, further comprising a second low voltage contact on the first low voltage pad, and a second low voltage pad on the second low voltage contact,
    wherein the second low voltage contact penetrates the second interlayer insulating layer, and the second low voltage pad and the bit line are on the second interlayer insulating layer.

9. The nonvolatile memory device of claim 7, further comprising a first low voltage gate pad on the low voltage gate contact, and a first high voltage gate pad on the high voltage gate contact,
    wherein the first low voltage gate pad, the first high voltage gate pad and the common source pad are on the first interlayer insulating layer.

10. The nonvolatile memory device of claim 9, further comprising a second low voltage gate contact on the first low voltage gate pad, and a second low voltage gate pad on the second low voltage gate contact,
    wherein the second low voltage gate contact penetrates the second interlayer insulating layer, and the second low voltage gate pad and the bit line are on the second interlayer insulating layer.

11. The nonvolatile memory device of claim 9, further comprising a second high voltage gate contact on the first high voltage gate pad, and a second high voltage gate pad on the second high voltage gate contact,
    wherein the second high voltage gate contact penetrates the second interlayer insulating layer, and the second high voltage gate pad and the bit line are on the second interlayer insulating layer.

12. The nonvolatile memory device of claim 3, further comprising a first high voltage gate contact on a gate of the high voltage transistor, and a first high voltage gate pad on the first high voltage gate contact,
    wherein the first high voltage gate contact penetrates the first interlayer insulating layer, and the first high voltage gate pad is on the first interlayer insulating layer.

* * * * *